United States Patent
Setija et al.

(10) Patent No.: US 12,393,046 B2
(45) Date of Patent: Aug. 19, 2025

(54) METROLOGY SYSTEMS, COHERENCE SCRAMBLER ILLUMINATION SOURCES AND METHODS THEREOF

(71) Applicants: ASML Netherlands B.V., Veldhoven (NL); ASML Holding N.V., Veldhoven (NL)

(72) Inventors: Irwan Dani Setija, Utrecht (NL); Arie Jeffrey Den Boef, Waalre (NL); Mohamed Swillam, Wilton, CT (US); Arjan Johannes Anton Beukman, Son en Breugel (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 760 days.

(21) Appl. No.: 17/764,057

(22) PCT Filed: Sep. 15, 2020

(86) PCT No.: PCT/EP2020/075785
§ 371 (c)(1),
(2) Date: Mar. 25, 2022

(87) PCT Pub. No.: WO2021/058338
PCT Pub. Date: Apr. 1, 2021

(65) Prior Publication Data
US 2022/0342228 A1    Oct. 27, 2022

Related U.S. Application Data

(60) Provisional application No. 62/907,049, filed on Sep. 27, 2019.

(51) Int. Cl.
G02B 27/48 (2006.01)
G02F 1/295 (2006.01)
G03F 7/00 (2006.01)

(52) U.S. Cl.
CPC .......... *G02B 27/48* (2013.01); *G02F 1/2955* (2013.01); *G03F 7/70616* (2013.01)

(58) Field of Classification Search
None
See application file for complete search history.

(56) References Cited

U.S. PATENT DOCUMENTS 6,297,876 B1  10/2001  Bornebroek
6,961,116 B2  11/2005  Den Boef et al.
(Continued)

FOREIGN PATENT DOCUMENTS

CN    101055429 A    10/2007
DE    10018810 A1    10/2001
(Continued)

OTHER PUBLICATIONS

International Search Report and Written Opinion of the International Searching Authority directed to related International Patent Application No. PCT/EP2020/075785, mailed Nov. 23, 2020; 10 pages.

(Continued)

*Primary Examiner* — Richard H Kim
(74) *Attorney, Agent, or Firm* — Sterne, Kessler, Goldstein & Fox P.L.L.C.

(57) ABSTRACT

A system includes a radiation source and a phased array. The phased array includes optical elements, waveguides and phase modulators. The phased array generates a beam of radiation. The optical elements radiate radiation waves. The waveguides guide radiation from the radiation source to the optical elements. The phase modulators adjust phases of the radiation waves such that the radiation waves accumulate to form the beam. An amount of incoherence of the beam is based on randomization of the phases.

15 Claims, 9 Drawing Sheets

(56) References Cited

U.S. PATENT DOCUMENTS

| | | |
|---|---|---|
| 7,511,799 B2 | 3/2009 | Tel et al. |
| 7,948,606 B2 | 5/2011 | Visser et al. |
| 8,706,442 B2 | 4/2014 | Mos et al. |
| 9,410,899 B2 | 8/2016 | Otaki et al. |
| 2005/0141810 A1 | 6/2005 | Vaez-Iravani et al. |
| 2008/0316567 A1 | 12/2008 | Grasser et al. |
| 2009/0195768 A1 | 8/2009 | Bijnen et al. |
| 2013/0258293 A1 | 10/2013 | Peng et al. |

FOREIGN PATENT DOCUMENTS

| | | |
|---|---|---|
| EP | 1 283 434 A2 | 2/2003 |
| JP | 2015-145811 A | 8/2015 |
| TW | 485429 B | 5/2002 |
| WO | WO 2018/001751 A1 | 1/2018 |

OTHER PUBLICATIONS

International Preliminary Report on Patentability directed to related International Patent Application No. PCT/EP2020/075785, issued Mar. 15, 2022; 7 pages.

Fukui et al., "On Ghost Imaging Using Multimode Fiber and Integrated Optical Phased Array," IEEE 2019 24th OptoElectronics and Communications Conference (OECC) and 2019 International Conference on Photonics in Switching and Computing (PSC), Jul. 7, 2019; 3 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, May 24, 1996; pp. 361-368.

Niu et al., "Specular Spectroscopic Scatterometry in DUV Lithography," Proc. of SPIE, Metrology, Inspection, and Process Control for Microlithography XIII, vol. 3677, Jun. 14, 1999; 10 pages.

METROLOGY SYSTEMS, COHERENCE SCRAMBLER ILLUMINATION SOURCES AND METHODS THEREOF

CROSS-REFERENCE TO RELATED APPLICATIONS

This application claims priority of U.S. Provisional Patent Application No. 62/907,049, which was filed on Sep. 27, 2019, and which is incorporated herein in its entirety by reference.

FIELD

The present disclosure relates to metrology systems with integrated optics, for example, illumination systems with on-chip coherence scramblers used in metrology systems for inspecting lithographic processes and wafer alignment.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an inspection apparatus (e.g., alignment apparatus) for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers may use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

As ICs become smaller and more densely packed, so too are increases in the number of features that must be inspected per wafer. It is desirable to improve the capabilities of metrology systems in order to keep pace with current high-volume manufacturing rates and improve production yields. Accordingly, there is a need to provide metrology tools capable of quickly and accurately measuring a large number of densely packed lithographic features. A measurement involves detecting scattered photons from a target over a finite period of time. To increase measurement speeds, metrology solutions may include, e.g., illuminating a target with more photons so as to shorten the detection period.

SUMMARY

In some embodiments, a system comprises a radiation source and a phased array. The phased array comprises optical elements, waveguides, and phase modulators. The phased array is configured to generate a beam of radiation. The optical elements are configured to radiate radiation waves. The waveguides are configured to guide radiation from the radiation source to the optical elements. The phase modulators are configured to adjust phases of the radiation waves such that the radiation waves accumulate to form the beam, wherein an amount of incoherence of the beam is based on randomization of the phases.

In some embodiments, a system comprises a radiation source, a waveguide, and an electrode. The waveguide is configured to guide radiation from the radiation source. The electrode is configured to adjust an electrical effect in the waveguide. The system is configured to generate a beam of radiation using the guided radiation. The amount of incoherence of the beam is based on a randomized adjustment of the electrical effect.

In some embodiments, a system comprises a radiation source, a multimode optical element, and a phased array. The phased array comprises optical elements, waveguides, and phased modulators. The multimode optical element is configured to output a beam of radiation. The optical elements are configured to radiate radiation waves. The waveguides are configured to guide radiation from the radiation source to the optical elements. The phase modulators are configured to adjust phases of the radiation in the waveguides such that the radiation waves accumulate to form a directed beam of radiation that impinges on an input surface of the multimode optical element. An amount of incoherence of the beam is based on randomization of a location of impingement of the directed beam on the input surface.

In some embodiments, a metrology system comprises a radiation source, a phased array, and a detector. The phased array comprises optical elements, waveguides, and phase modulators. The phased array is configured to generate a beam of radiation to illuminate a target. The optical elements are configured to radiate radiation waves. The waveguides are configured to guide radiation from the radiation source to the optical elements. The phase modulators are configured to adjust phases of the radiation waves such that the radiation waves accumulate to form the beam, wherein an amount of incoherence of the beam is based on adjustments of the phases. The detector is configured to receive radiation scattered by the target and to generate a measurement signal based on the received radiation.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
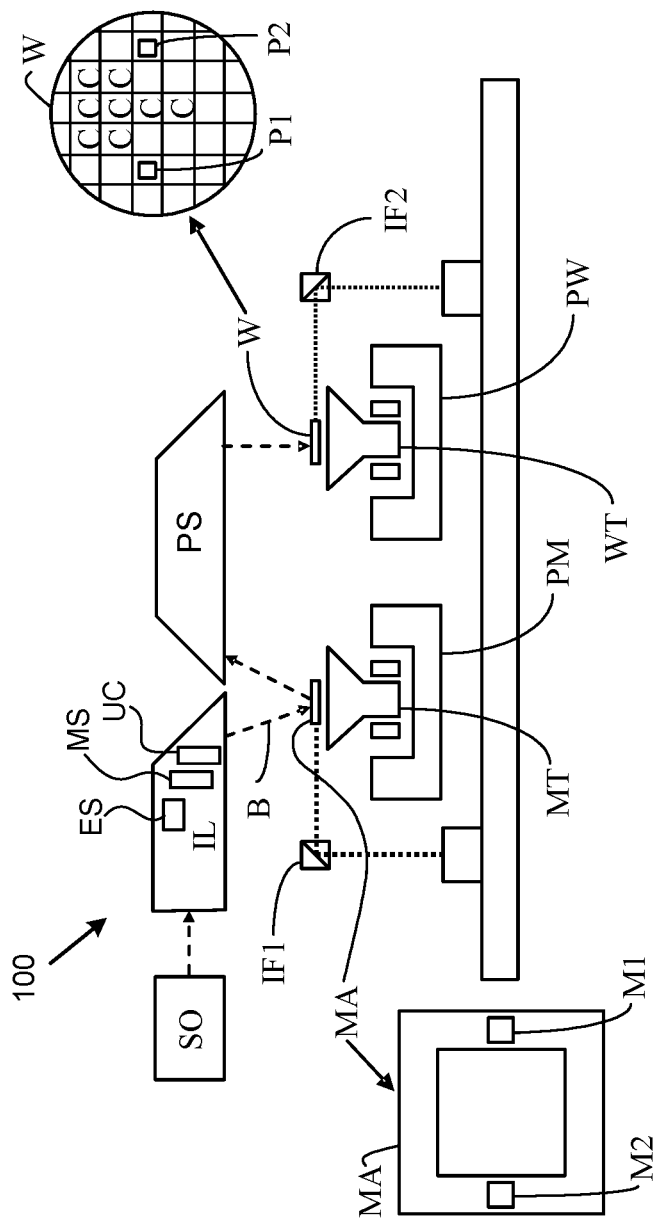
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" may indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
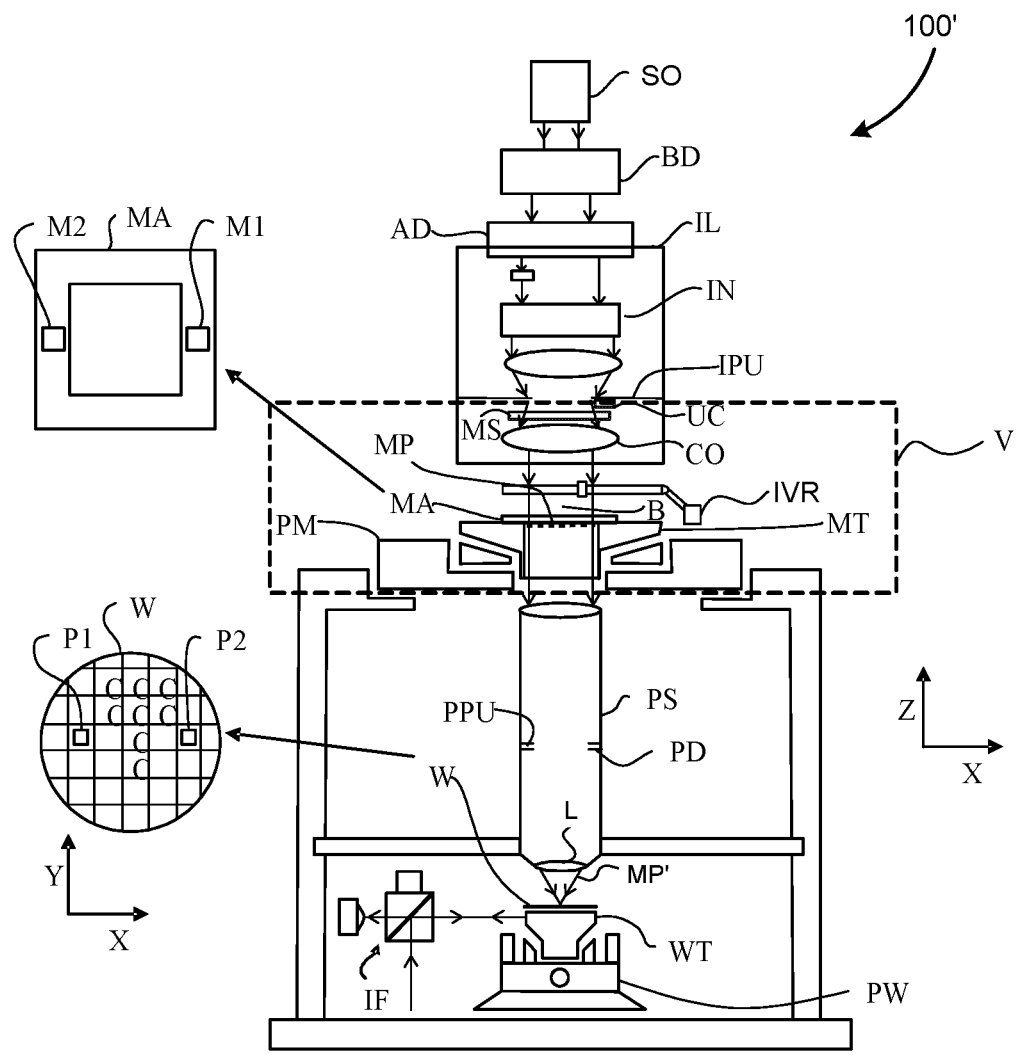
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
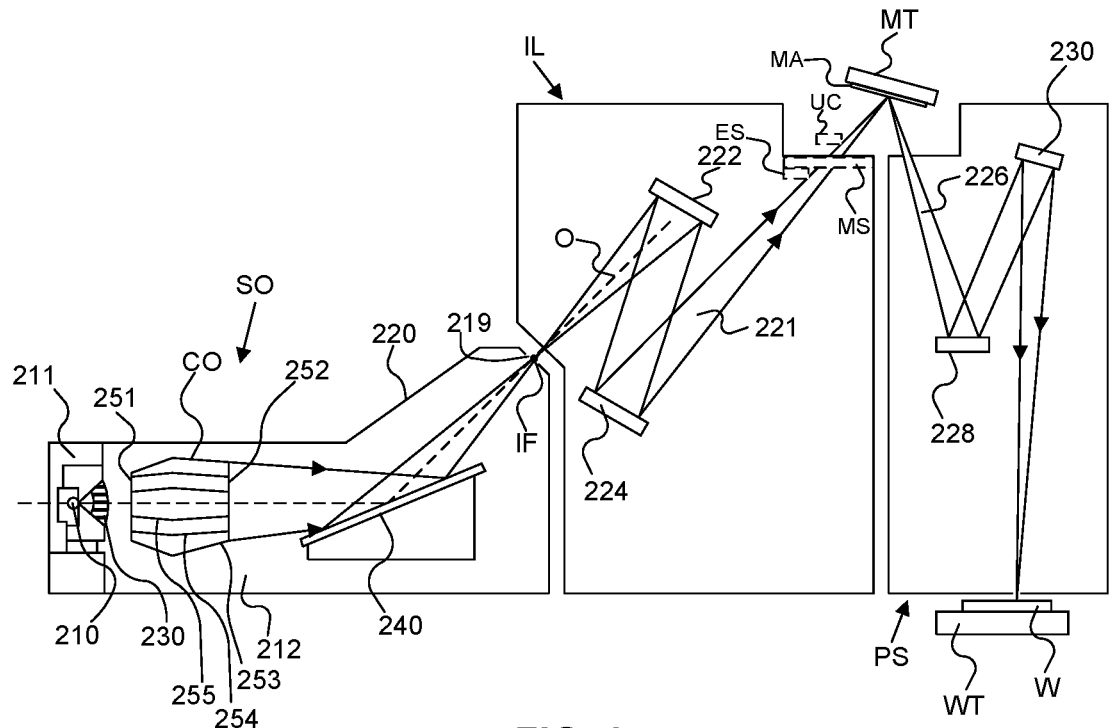
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
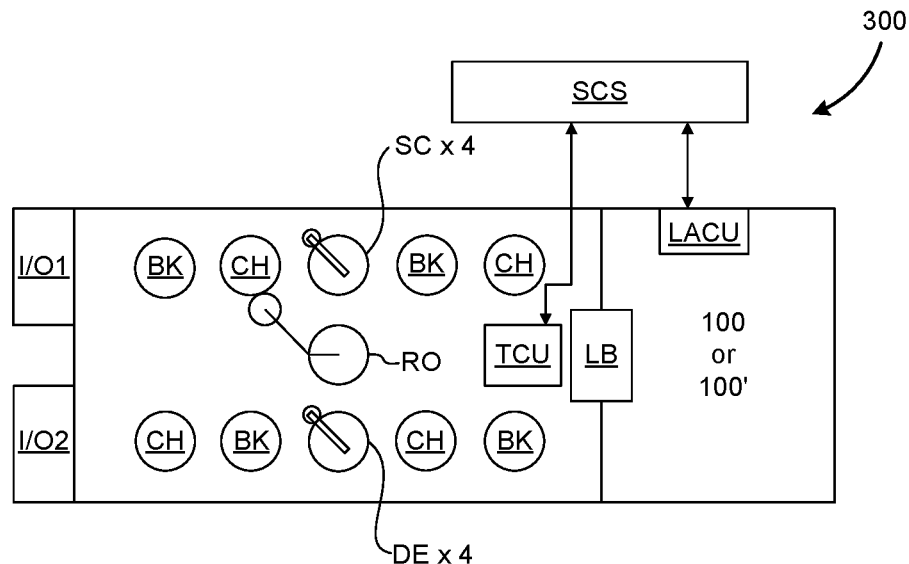
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatuses

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement may be performed using the techniques described in U.S. Publication No. 2009/195768 A (Bijnen et al.), however. The full contents of both of these disclosures are incorporated herein by reference.

Figure 4A:
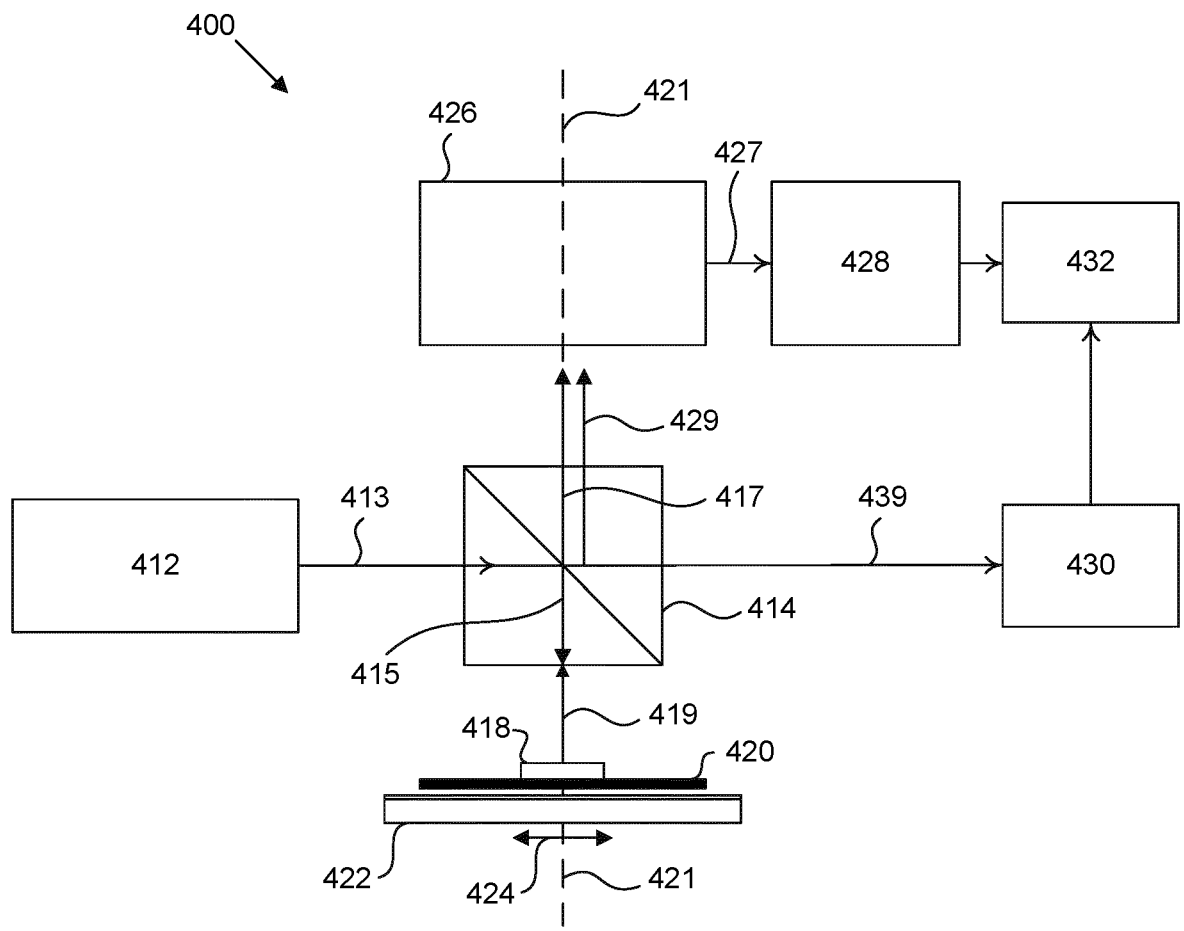
FIGS. 4A and 4B show schematics of inspection apparatuses, according to some embodiments.

FIG. 4A shows a schematic of a cross-sectional view of an inspection apparatus 400, according to some embodiments. In some embodiments, inspection apparatus 400 may be implemented as part of lithographic apparatus 100 or 100'. Inspection apparatus 400 may be configured to align a substrate (e.g., substrate W) with respect to a patterning device (e.g., patterning device MA). Inspection apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, inspection apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., inspection apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of inspection apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data may for example be obtained with any type of alignment sensor, for example a SMASH (SMart Alignment Sensor Hybrid) sensor, as described in U.S. Pat. No. 6,961, 116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 may be configured to determine a position of inspection apparatus 400 or any other reference element such that the center of symmetry of alignment mark or target 418 can be known with reference to inspection apparatus 400 or any other reference element. Beam analyzer 430 may be a point or an imaging polarimeter with some form of wavelength-band selectivity. In some embodiments, beam analyzer 430 may be directly integrated into inspection apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 may be found in the metrology apparatus known as Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

Figure 4B:
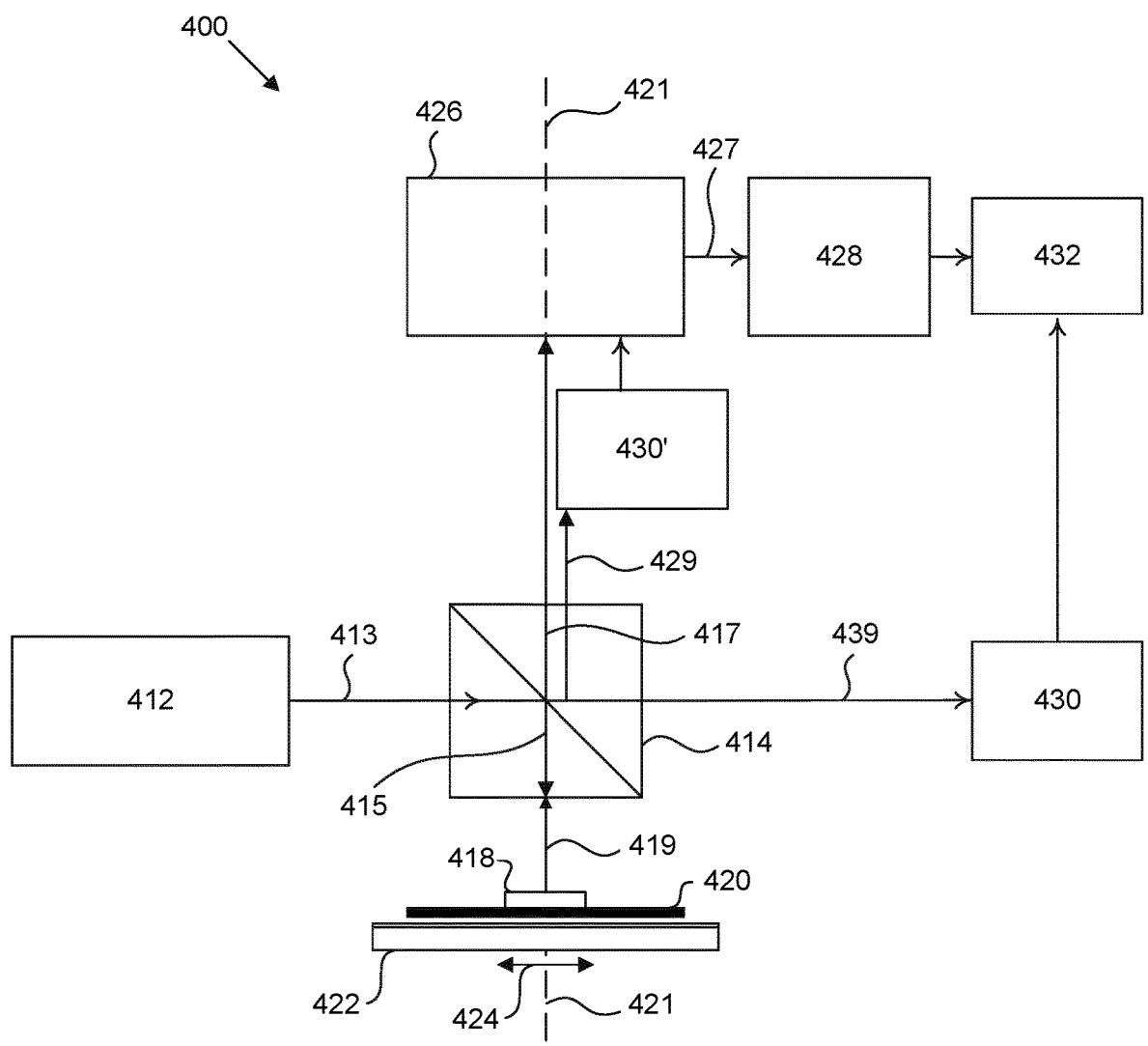

In some embodiments, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of inspection apparatus 400, or any other reference element, such that the center of symmetry of alignment mark or target 418 may be known with reference to inspection apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into inspection apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the inspection apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the inspection apparatus 400.

Exemplary Illumination Systems Using Coherence Scramblers

As ICs continue to shrink, users of lithographic tools demand smaller and more densely packed alignment marks in their efforts to maximize efficient wafer use. In some embodiments, increasing the number of lithographic features on a wafer increases the number of targets that must be inspected per wafer. Inspecting more targets per wafer may lower production throughput. Therefore, it is desirable for inspection systems to measure targets faster. The speed of wafer inspection can be increased by, for example, decreasing the time per measurement (e.g., by collecting more photons). A laser is an example of a powerful illumination source. However, lasers provide coherent radiation, which may cause speckles to form in the illumination and detected beams. Speckles may form in beams of radiation due to interfering portions of the coherent radiation. In turn, speckling may cause optical measurements to yield incorrect results (e.g., incorrect alignment position). Incoherent radiation sources may avoid speckling issues at the cost of limited intensity (e.g., low photon count on a target).

The term "coherence scrambling," and the like, may be used herein to refer to the phenomena where coherent radiation is converted into incoherent or quasi-coherent radiation either in part or in full. Coherence scrambling may entail, for example, increasing incoherence of a beam of radiation or changing a spatial intensity distribution of quasi-coherent wavefronts over time.

Coherent illumination sources may generate beams of radiation that have higher intensity and are more energy efficient than traditional incoherent sources of radiation. In some embodiments, coherent radiation may be disrupted so as to convert it into incoherent radiation. One method may be using a mechanical coherence scrambler. In some embodiments, a mechanical coherence scrambler comprises a source of coherent radiation and a rotating diffuser plate. Coherent radiation may be incident on the rotating diffuser plate. The radiation may scatter with randomized phases. The randomized phases may be due to the illumination being incident on a rough surface that changes over time, due to the rotation of the rotating diffuser plate. The scattered light may then be collected into a beam of incoherent radiation and sent to a target. The beam of incoherent radiation may generate a speckle pattern that continually changes at a rate based on the roughness profile of the rotating diffuser plate and its speed of rotation.

In some embodiments, a metrology system may comprise the mechanical coherence scrambler to generate a beam of incoherent radiation to send to a target. As the illumination from the target is collected at a detector, a finite detection period is selected so that the varying speckle pattern may be integrated (e.g., averaged out).

Mechanical coherence scramblers suffer a variety of disadvantages. In some embodiments, diffuser plates may cause inefficient use of photons (e.g., many stray photons are lost), thus reducing the benefit of high-intensity from a coherent radiation source. Regarding speed of measurement, demands of the industry are gravitating toward metrology systems that can measure a target in milliseconds or less. A coherence scrambler may have to vary a speckle pattern over, for example, 1000 times in a detection period to attain a suitable averaging. However, a rotating diffuser plate may be limited to rotational speeds in the range of kHz. Thus, a rotating diffuser plate may fall short of providing a quickly varying speckle pattern. Additionally, having fast moving mechanical component in a clean environment (e.g., a lithographic apparatus) may present problems, such as vibrations and catastrophic failure (e.g., irreparable damage or contamination of lithographic apparatus when rotating element produces projectiles).

Embodiments of the present disclosure provide structures and functions to more quickly and efficiently perform inspection of structures on a substrate, for example, using coherence scramblers to convert a powerful coherent illumination source into a powerful incoherent illumination source for illuminating a target. In some embodiments, coherence scramblers structures and functions may be implemented on-chip (e.g., integrated optics, photonic integrated circuit (PIC), no moving elements). It is instructive to present structures and functions related to coherent radiation (e.g., phased arrays and beam directionality) before describing embodiments implementing coherence scramblers.

Figure 5:
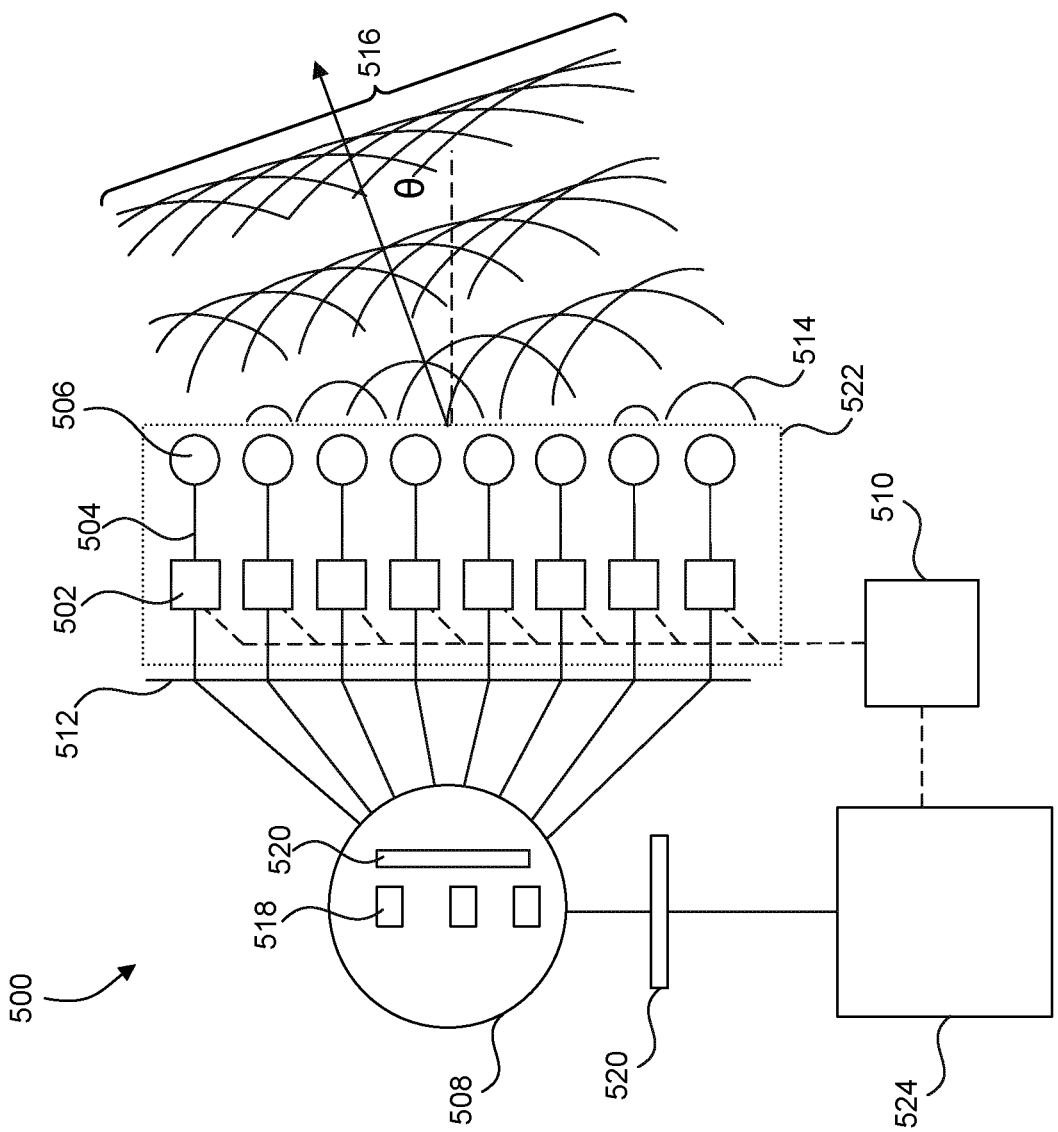
FIGS. 5-7 show a schematic of an illumination system, according to some embodiments.

FIG. 5 shows a schematic of an illumination system 500, according to some embodiments. In some embodiments, illumination system 500 may be implemented as part of an inspection apparatus, e.g., as illumination system 412 in inspection apparatus 400 (FIGS. 4A and 4B).

In some embodiments, illumination system 500 comprises phase modulators 502, waveguides 504, and optical elements 506. Illumination system 500 may further comprise a radiation source 508 and/or a controller 510. Phase modulators 502 may comprise electro-optic modulators (e.g., Pockels cells), thermo-optic modulators, piezo-optic modulators, and the like.

In some embodiments, phase modulators 502 are disposed along waveguides 504 (e.g., intersecting or adjacent to waveguides). In some embodiments, optical elements 506 are disposed downstream of phase modulators 502 along waveguides 504. In some embodiments the number of phase modulators 502, waveguides 504, and optical elements 506 are equal (e.g., there is a one-to-one-to-one correspondence in a set of a phase modulator, waveguide, and optical element). In some embodiments, phase modulators 502, waveguides 504, and optical elements 506 are arranged as a so-called phased array (e.g., an array of radiation elements for generating radiation having given phases).

In some embodiments, waveguides 504 are configured to guide radiation. The radiation may be supplied by radiation source 508 and received at inputs of the phased array. Merely as an example, line 512 indicates the inputs. Waveguides 504 may be configured to guide radiation (e.g., from radiation source 508) to optical elements 506. Optical elements 506 may be configured to outcouple radiation from the waveguides. In other words, optical elements 506 may radiate radiation waves 514 (e.g., by outcoupling the radiation from waveguides 504). Optical elements 506 may be referred to herein as "emitters," "emission elements," and the like, referencing their function of emitting radiation. Phase modulators 502 are configured to adjust phases of radiation waves 514. In other words, phase modulators 502 may adjust an electrical effect in waveguides 504 that alter phases of radiation (e.g., changing a refractive index of the waveguide). Electrical effects may be, for example, electro-optic effects (e.g., Pockels effect), thermo-optic effects, piezo-optic effects, and the like.

In some embodiments, the phases of radiation waves 514 are adjusted such that radiation waves 514 accumulate to form a beam of radiation 516. The direction of beam of radiation 516 is based on the phases of radiation waves 514.

The phased array of illumination system 500 may generate of radiation 516 and to direct beam of radiation 516 (e.g., toward a target structure). Phase modulation may comprise adjusting phase delays of radiation waves 514. Phase modulation may comprise staggering phase delays of radiation waves 514. In FIG. 5, the direction angle θ of beam of radiation 516 is provided as an example and is not limiting. It should also be appreciated that illumination system 500 may comprise a 2-dimensional phased array. A 2-dimensional arrangement may allow adjusting the direction of beam of radiation 516 in two dimensions (e.g., out of the page; FIG. 5 shows a 1-dimensional array for simplicity).

In some embodiments, illumination system 500 comprises a PIC. In other words, illumination system 500 and components therein (e.g., radiation sources, phase modulators, etc.) may be part of a PIC. The PIC allows illumination system 500 to be built extremely small (e.g., sub-millimeter). In some embodiments, illumination system 500 may reduce the number of optical components in a metrology tool. For example, it is possible to reduce or eliminate the need for optical hardware traditionally used to direct light (e.g., lens, mirror, beam splitter, micro-electro-mechanical system (MEMS), and the like). Illumination system 500 may adjust the direction beam of radiation 516 without using optical hardware or moving elements (e.g., mechanical elements).

In some embodiments, controller 510 is configured to control phase modulators 502 to control the direction of beam of radiation 516. It should be appreciated that controller 510 may be external to illumination system 500 (e.g., a controller in a metrology system or a lithographic system).

In some embodiments, radiation source 508 is configured to generate broadband wavelengths or two or more narrowband wavelengths. In some embodiments, radiation source 508 comprises two or more source elements 518. Each source element of source elements 518 may be configured to generate a subset of the broadband wavelengths and/or the two or more narrowband wavelengths. The radiation generated by radiation source 508 may be coherent radiation. When generating multiple wavelengths with a single source element, each wavelength component may be coherent. In some embodiments, illumination system 500 may generate a beam(s) with a wavelength from a range of selectable wavelengths (e.g., $\lambda_1, \lambda_2 \ldots \lambda_N$). Multi-wavelength coherent radiation sources are commercially available. Source elements 518 may be, e.g., laser diodes.

For ease of discussion, a first phased array 522 is designated by a dotted outline. In some embodiments, illumination system 500 comprises a second phased array 524. For simplicity, phased array has been drawn with simplified inputs from source radiation source 508 and controller 510. However, it should be appreciated that elements and arrangements within second phased array 524 are substantially similar (e.g., symmetrized) to first phased array 522. In some embodiments, illumination system comprises more phased arrays.

In some embodiments, one or more spectral filters 520 may be used to select one or more wavelengths from radiation source 508 to enter first and second phased arrays 522 and 524. For example, first and second spectral filters may be used to select respective first and second wavelengths from radiation source 508. A first wavelength may enter first phased array 522 and the second wavelength may enter second phased array 524. First phased array 522 may generate beam of radiation 516 having the first wavelength and second phased array 524 may be used to generate another beam of radiation having the second wavelength.

The first and second wavelengths may be substantially different or similar. A direction of the beam from second phased array 524 may be adjusted independently from beam of radiation 516 (e.g., toward a target structure).

Until now, discussion has focused on the coherent nature of phased arrays. However, phased arrays may also be used for incoherent radiation generation. In some embodiments, phase modulators 502 are configured to adjust the phases of radiation waves 514 with varying degrees of randomization. An amount of incoherence of beam of radiation 516 may be based on the randomization of the phases of radiation waves 514. Randomization operations described herein may be based on, for example, true random algorithms, pseudo-random algorithms, chaos, and the like. Embodiments where beam of radiation 516 is incoherent, partially or fully, may be sourced with a powerful coherent source (e.g., radiation source 508). However, it is to be appreciated that beam directionality may be hindered by the incoherence since beam directionality may be dependent on constructive interference of radiation waves 514.

In some embodiments, controller 510 may control the phase modulators to control the randomization of the phases of radiation waves 514 so as to adjust the amount of incoherence of beam of radiation 516. Consequently, phased array 522 may adjust the amount of incoherence of beam of radiation 516 without moving elements.

Earlier, the importance of switching speed was emphasized in reference to a mechanical coherence scrambler. In some embodiments, the use of phase modulators 502 allow very fast switching of a speckle pattern. Since the spatial distribution of the speckle pattern is randomized, it may be said that the spatial coherence of beam of radiation 516 is scrambled over time. Coherence scrambling may be achieved by exploiting optical effects with phase modulators 502. Optical effects may comprise electro-optic, thermo-optic, piezo-optic, and the like, which are capable of switching at greater than megahertz or gigahertz speeds. In some embodiments, phase modulators 502 may adjust (e.g., randomize, partially randomize, and the like) phases of radiation waves 514 at a frequency of approximately 10 kHz or greater, 100 kHz or greater, 1 MHz or greater, 10 MHz or greater, 100 MHz or greater, 1 GHz or greater, or 10 GHz or greater. In some embodiments, phase modulators 502 adjust phases of radiation waves 514 at a frequency of approximately 100 kHz-10 GHz, 1 MHz-10 GHz, 10 MHz-10 GHz, 100 MHz-10 GHz, 1 GHz-10 GHz, 100 kHz-1 GHz, 1 MHz-1 GHz, 10 MHz-1 GHz, 100 MHz-1 GHz, 100 kHz-100 MHz, 1 MHz-100 MHz, or 10 MHz-100 MHz.

The term "detection," "detection event," and the like may be used herein in reference to receipt of radiation from a target, at a detector, in conjunction with a measurement. In some embodiments, even if a detection event has a time period of 1 ms, the number of different speckle patterns formed at a detector may be approximately 1000 or greater, perhaps even 106 or greater, in the detection time period.

Referring again to FIG. 4, in some embodiments, detector 428 may comprise a camera (e.g., CCD camera). The camera may be used to acquire one or more images of target 418. It is to be appreciated that detector 428 may receive radiation having a time-varying speckle pattern. The total intensity received at each detector element (e.g., pixel) may be integrated (or aggregated) over the time period. Thus the effects of speckling may be averaged out for each detector element. Since a phased-array-based coherence scrambler allows for fast switching of the speckle pattern (see phase adjustment frequencies above), detector 428 may generate an image having an averaged speckle pattern over a period of is or less, 1 ms or less, 100 µs or less, 10 µs or less, 1 µs or less, or 100 ns or less.

Consequently, optical measurements using a phased-array-based coherence scrambler for illumination may increase wafer inspection speed, and therefore increase throughput of wafer production. Moreover, phased-array-based coherence scramblers increase efficiency of photon use. Phased arrays are configured to guide radiation from a source to a target with little to no waste, whereas a rotating diffuser plate affords almost no control over wastefully diffused photons.

Figure 6:
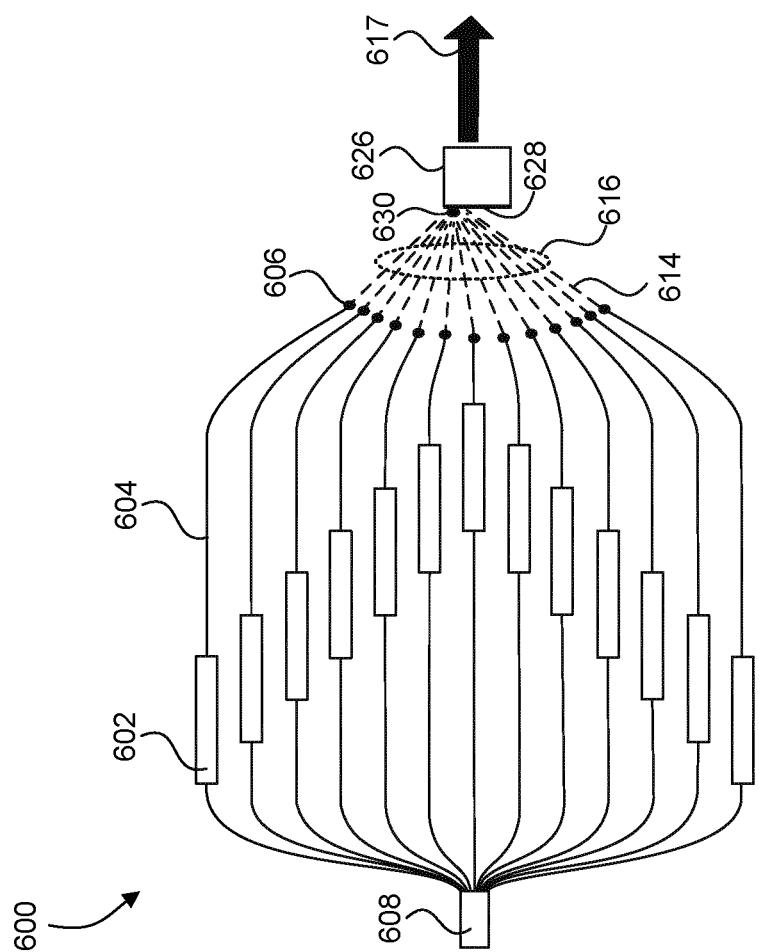

In the embodiments referencing FIG. 5, the coherence scrambling function was described in a manner that may reduce beam directionality. However, beam directionality may yet be used in conjunction with coherence scrambling. FIG. 6 shows a schematic of an illumination system 600. In some embodiments, illumination system 600 may be implemented as part of an inspection apparatus, e.g., as illumination system 412 in inspection apparatus 400 (FIGS. 4A and 4B).

In some embodiments, illumination system 600 comprises phase modulators 602, waveguides 604, optical elements 606, a radiation source 608, and a multimode optical element 626. Elements of FIG. 6 may have similar structures and functions as similarly numbered elements in FIG. 5 (e.g., elements sharing the two right-most digits). It should be appreciated that certain components are not shown in FIG. 6, for clarity, but may still be present as described in reference to FIG. 5, for example, controller 510, source elements 518, phase modulator structures and functions, multi-wavelength functionality and selectability, beam directionality, PIC integration, etc. In some embodiments, phase modulators 602, waveguides 604, and optical elements 606 may be parts of a phased array. Optical elements may be a structure for outcoupling radiation, for example, an exit interface. Multimode optical element 626 may comprise an input surface 628. Locations on input surface 628 may be used to incouple radiation in given propagation modes within multimode optical element 626. Multimode optical element 626 may comprise a multimode optical fiber or waveguide.

In some embodiments, optical elements may radiate radiation waves 614. Radiation waves 614 may accumulate to form a directed beam of radiation 616. A direction of directed beam of radiation 615 may be based on the phases of radiation waves 614. The direction of directed beam of radiation 616 may be adjusted using phase modulators 602. Directed beam of radiation 616 may impinge on multimode optical element 626 at a location of impingement 630 of input surface 628. Multimode optical element 626 may guide incoupled radiation from directed beam of radiation 616 and output a beam of radiation 617. Beam of radiation 617 may be incident on a target. Beam of radiation 617 may have a speckle pattern that is based on the propagation mode(s) used in multimode optical element 626 (e.g., based on location of impingement 630). That is, different propagation modes may result in different speckle patterns. Consequently, a reason for using multimode optical element 626, as opposed to a single-mode optical element, is that the single-mode optical element may not be able to provide much variance in speckle patterns to properly manipulate the degree of incoherence in beam of radiation 617.

In some embodiments, the speckle pattern may be an interference effect. An interference effect may be adjusted over time based on adjustments of location of impingement 630 on input surface 628. The adjustments of location of impingement 630 may comprise illumination of a sequence of locations (e.g., a raster pattern) on input surface 628 that results in beam of radiation 617 having a time-averaged speckle pattern. Adjustments other than sequenced locations are also envisioned (e.g., randomized locations, partially randomized locations, and any combinations of such adjustments). It is to be appreciated that randomization operations described in reference to FIGS. 5 and 7 may also be modified to employ adjustments other than randomization (e.g., a sequence of phase adjustments that result in a time-averaged speckle pattern, partially randomized sequences, and any combination of such sequences). Thus, an amount of incoherence of beam of radiation 617, as viewed over time, may be based on a randomization of location of impingement 630 of directed beam of radiation 616 on input surface 628. Location of impingement 630 may be selected by adjusting directions of beam of radiation 616, for example, by adjusting the phases of radiation waves 614. Different locations on input surface 628 may correspond to different presets of the phased array (e.g., presets of phase modulators 602). In turn, the presets may correspond to activations of distinct selections of one or more propagation modes in multimode optical element 626. To adjust location of impingement 630, the presets may be adjusted. Preset adjustments may be performed using a controller (e.g., controller 510 in FIG. 5).

In some embodiments, since the adjustment of the presets may be performed using phase modulators 602, the frequencies at which the adjustments occurs may be as described in reference to FIG. 5. Consequently, detection periods in metrology systems that use illumination system 600 may be shortened as described in reference to FIG. 5.

Figure 7:
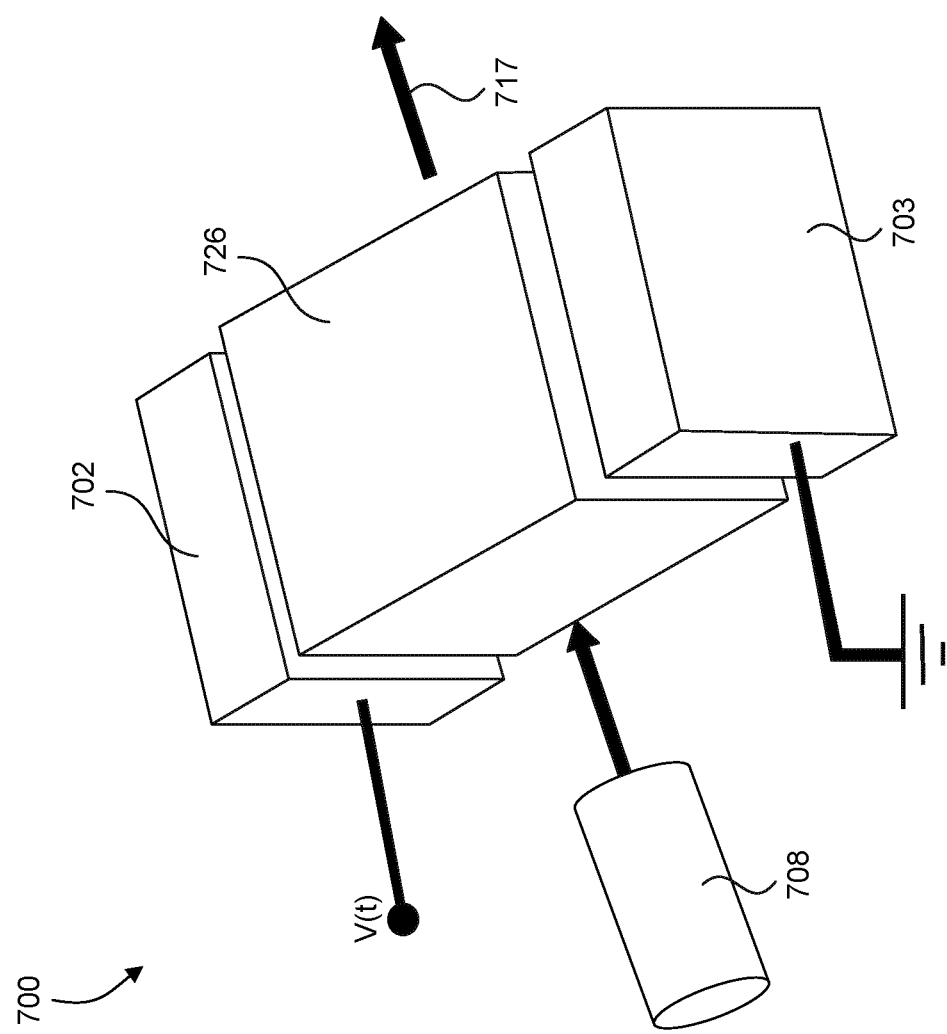

Other arrangements of illumination systems may be possible, for example, ones that may omit phased arrays. FIG. 7 shows an illumination system 700, according to some embodiments. In some embodiments, illumination system 700 may be implemented as part of an inspection apparatus, e.g., as illumination system 412 in inspection apparatus 400 (FIGS. 4A and 4B)

In some embodiments, illumination system 700 comprises electrodes 702 and 703, a radiation source 708, and a multimode optical element 726. Elements of FIG. 7 may have similar structures and functions as similarly numbered elements in FIGS. 5 and 6 (e.g., elements sharing the two right-most digits). It should be appreciated that certain components are not shown in FIG. 6, for clarity, but may still be present as described in reference to FIGS. 5 and 6, for example, controller 510, source elements 518, phase modulator structures and functions, multi-wavelength functionality and selectability, PIC integration, etc. Multimode optical element 726 may comprise a multimode optical fiber or waveguide.

In some embodiments, electrodes 702 and 703 may be disposed on or near multimode optical element 726. Electrode 702 may be disposed on diametrically opposite sides of multimode optical element 726. Electrode 702 may receive a voltage V(t) (e.g., from a controller or power supply). Electrode 703 may provide a reference voltage (e.g., ground) for electrode 702. Electrodes 702 and 703 may be used to adjust an electrical effect in multimode optical element 726. The arrangement of electrodes 702 and 703 about an optical element may be used as a phase modulator (e.g., phase modulators 502 (FIG. 5) and 602 (FIG. 6)). Radiation from radiation source 708 may impinge on multimode optical element 726. Multimode optical element 626 may guide incoupled radiation from radiation source 708 and output a beam of radiation 717. Beam of radiation 717 may be incident on a target. Beam of radiation 717 may have a speckle etendue that is based on optical properties of multimode optical element 726. The term "etendue" may be used herein to refer to a property of light of an optical system that characterizes a spread of illumination intensity based on direction of propagation and spatial distribution (e.g., solid angle with respect to a point of origin).

In some embodiments, the speckle etendue may be randomized or partially randomized over time based on adjustments of an electrical effect in multimode optical element 726. Thus, an amount of incoherence of beam of radiation 717 is so adjusted. Adjustments of the electrical effect may comprise adjusting (e.g., randomly, partially randomly, or in a set sequence) the voltage at electrodes 702 and/or 703. Adjustments of the electrical effect may be performed using a controller (e.g., controller 510 in FIG. 5).

In some embodiments, since the randomization of the electrical effects may be performed using structures and functions similar to phase modulators 502 (FIG. 5), the frequencies at which the randomization occurs may be as described in reference to FIG. 5. Consequently, detection periods in metrology systems that use illumination system 700 may be shortened as described in reference to FIG. 5.

Figure 8:
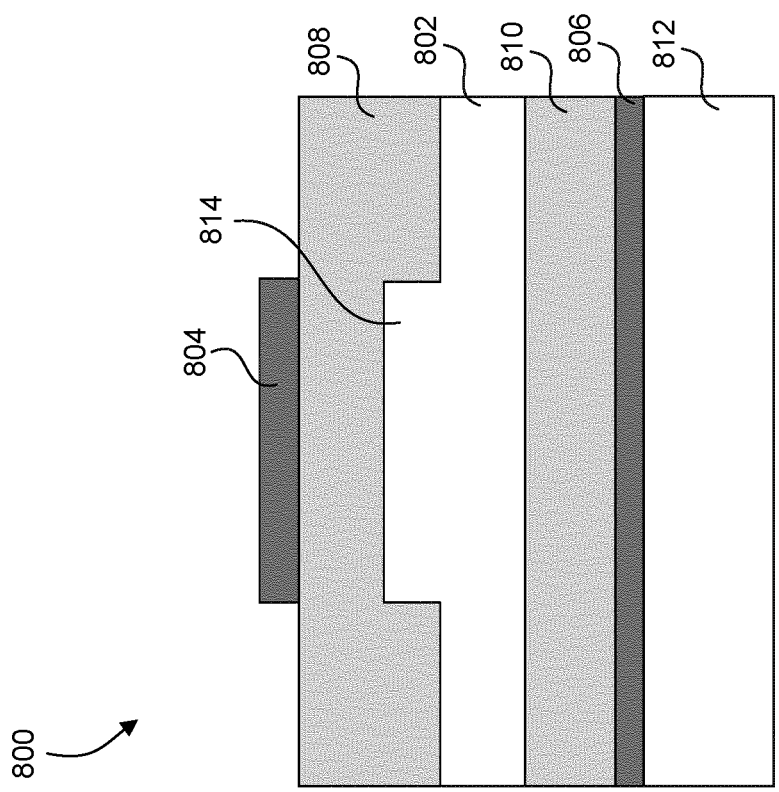
FIG. 8 shows a cross-sectional schematic of a phase modulator, according to some embodiments.

FIG. 8 shows a cross-sectional schematic of a phase modulator 800, according to some embodiments. In some embodiments phase modulator 800 may be an electro-optic modulator. Phase modulator 800 may be used in illumination systems 500 (FIG. 5), 600 (FIG. 6), or 700 (FIG. 7).

In some embodiments, phase modulator 800 may be fabricated as a PIC stack. Phase modulator 800 may comprise a waveguide 802, an electrode 804 and an electrode 806. In some embodiments, phase modulator 800 may further comprise dielectric layers 808 and 810 and a substrate 812. Waveguide 802 may comprise a ridged waveguide having a ridge structure 814. Waveguide 802 may comprise an electro-optical crystal (e.g., LiNbO3). Electrodes 804 and 806 may comprise electrically conductive material. Dielectric layers 808 and 810 may comprise dielectric material (e.g., SiO2). Substrate 812 may comprise any suitable material for supporting the PIC stack (e.g., a semiconductor, dielectric material).

In some embodiments, electrodes 804 and 806 are disposed on opposite sides of waveguide 802. Dielectric layer 808 may be sandwiched between waveguide 802 and electrode 804. Dielectric layer 808 may be used to set a given separation between waveguide 802 and electrode 804 for optimizing applied electric fields, electrical effects, and the like. A similar relationship is applicable to dielectric layer 810, electrode 806, and waveguide 802.

In the cross-sectional depiction of FIG. 8, in some embodiments, radiation may propagate through waveguide 802 into or out of the page. As radiation propagates through waveguide 802, the propagation behavior may be modified by the presence of a voltage on electrode 804 or electrode 806. In the case of an electro-optic crystal, a refractive index of waveguide 802 may be adjusted to adjust a phase of the radiation that passes through the region where the voltage is applied.

Though FIG. 8 has been discussed in reference to an electro-optic phase modulator, it should be appreciated that thermo-optic and piezo-optic modulators may be constructed in a similar fashion, wherein a suitable thermo-optic or piezo-optic crystal is used for the waveguide and the corresponding thermo-optic or piezo-optic effect is instigated directly or indirectly by an action (e.g., applying a voltage).

Other aspects of the invention are set out in the following numbered clauses.

1. A system comprising:
a radiation source; and
a phased array configured to generate a beam of radiation, the phased array comprising:
optical elements configured to radiate radiation waves;
waveguides configured to guide radiation from the radiation source to the optical elements; and
phase modulators configured to adjust phases of the radiation waves such that the radiation waves accumulate to form the beam, wherein an amount of incoherence of the beam is based on randomization of the phases.

2. The system of clause 1, further comprising a controller configured to control the phase modulators to control the randomization so as to adjust the amount of incoherence.

3. The system of clause 1, wherein the phased array is configured to adjust the amount of incoherence without moving elements.

4. The system of clause 1, wherein the phased array further comprises a photonic integrated circuit.

5. The system of clause 1, wherein each of the phase modulator comprises an electro-optic phase modulator.

6. The system of clause 1, wherein each of the phase modulators comprises a thermo-optic modulator or a piezo-optic modulator.

7. The system of clause 1, wherein the radiation source is configured to generate broadband wavelengths or two or more narrowband wavelengths.

8. The system of clause 6, wherein:
the radiation source comprises source elements; and
each of the source elements is configured to generate a subset of the broadband wavelengths or the two or more narrowband wavelengths.

9. The system of clause 1, further comprising a spectral filter configured to select a wavelength from the radiation source to enter the phased array, wherein the beam has the wavelength.

10. The system of clause 1, wherein the phase modulators are further configured to adjust the phases at a frequency of approximately 100 kHz or greater.

11. The system of clause 1, wherein the phase modulators are further configured to adjust the phases at a frequency of approximately 1 GHz or greater.

12. A system comprising:
a radiation source;
a waveguide configured to guide radiation from the radiation source;
an electrode configured to adjust an electrical effect in the waveguide,
wherein the system is configured to generate a beam of radiation using the guided radiation, and
wherein an amount of incoherence of the beam is based on a randomized adjustment of the electrical effect.

13. The system of clause 12, further comprising a controller configured to control the electrode to control the randomized adjustment so as to adjust the amount of incoherence.

14. The system of clause 12, wherein the phase modulators are further configured to perform the randomized adjustment at a frequency of approximately 100 kHz or greater.

15. The system of clause 12, wherein the system further comprises a photonic integrated circuit.

16. A system comprising:
a radiation source;
a multimode optical element configured to output a beam of radiation;
a phased array configured to generate a directed beam of radiation, the phased array comprising:
optical elements configured to radiate radiation waves;
waveguides configured to guide radiation from the radiation source to the optical elements; and
phase modulators configured to adjust phases of radiation in the waveguides such that the radiation waves accumulate to form a directed beam of radiation that impinges on an input surface of the multimode optical element, wherein an amount of incoherence of the beam is based on adjustments of a location of impingement of the directed beam on the input surface.

17. The system of clause 16, further comprising a controller configured to control the phase modulators to control the adjustments of the location of impingement.

18. The system of clause 16, wherein the phase modulators are further configured to adjust the phases at a frequency of approximately 100 kHz or greater.

19. The system of clause 16, wherein the system further comprises a photonic integrated circuit.

20. A metrology system comprising:
a radiation source;
a phased array configured to generate a beam of radiation to illuminate a target, the phased array comprising:
optical elements configured to radiate radiation waves,
waveguides configured to guide radiation from the radiation source to the optical elements, and
phase modulators configured to adjust phases of the radiation waves such that the radiation waves accumulate to form the beam, wherein an amount of incoherence of the beam is based on randomization of the phases; and
a detector configured to receive radiation scattered by the target and to generate a measurement signal based on the received radiation.

Image-based inspection techniques may use embodiments described herein to, for example, for inspect overlay of lithographic layers and/or align a wafer to receive a lithographic layer via a lithographic process. Using embodiments described herein, optical inspection operations may be made quicker and safer than when using illumination systems with mechanical coherence scramblers. Faster inspection allows for increased wafer production throughput. Embodiments disclosed herein are capable of guiding radiation from a source to a target with little to no waste, in contrast to inefficient mechanical coherence scramblers.

In some embodiments, metrology systems, phased arrays, coherence scramblers, and associated optical elements of the present disclosure may be configured to work in wavelength ranges spanning UV, visible, and IR (e.g., approximately 400-2000 nm).

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A system comprising:
   a radiation source;
   a multimode optical element configured to output a beam of radiation;
   a phased array configured to generate a directed beam of radiation, the phased array comprising:
   optical elements configured to radiate radiation waves;
   waveguides configured to guide radiation from the radiation source to the optical elements; and
   phase modulators configured to adjust phases of radiation in the waveguides such that the radiation waves accumulate to form the directed beam of radiation that impinges on an input surface of the multimode optical element, wherein an amount of incoherence of the beam of radiation is based on adjustments of a location of impingement of the directed beam on the input surface.

2. The system of claim 1, further comprising a controller configured to control the phase modulators to control the adjustments of the location of impingement.

3. The system of claim 1, wherein the phase modulators are further configured to adjust the phases at a frequency of approximately 100 kHz or greater.

4. The system of claim 1, wherein the system further comprises a photonic integrated circuit.

5. A metrology system comprising:
   a radiation source;
   a phased array configured to generate a beam of radiation to illuminate a target, the phased array comprising:
   optical elements configured to radiate radiation waves,
   waveguides configured to guide radiation from the radiation source to the optical elements, and
   phase modulators configured to adjust phases of the radiation waves such that the radiation waves accumulate to form the beam of radiation, wherein an amount of incoherence of the beam of radiation is based on randomization of the phases; and
   a detector configured to receive radiation scattered by the target and to generate a measurement signal based on the received radiation.

6. The system of claim 5, further comprising a controller configured to control the phase modulators to control the randomization so as to adjust the amount of incoherence.

7. The system of claim 5, wherein the phased array is configured to adjust the amount of incoherence without moving the optical elements.

8. The system of claim 5, wherein the phased array further comprises a photonic integrated circuit.

9. The system of claim 5, wherein each of the phase modulators comprises an electro-optic phase modulator.

10. The system of claim 5, wherein each of the phase modulators comprises a thermo-optic modulator or a piezo-optic modulator.

11. The system of claim 5, wherein the radiation source is configured to generate broadband wavelengths or two or more narrowband wavelengths.

12. The system of claim 11, wherein:
the radiation source comprises source elements; and
each of the source elements is configured to generate a subset of the broadband wavelengths or the two or more narrowband wavelengths.

13. The system of claim 5, further comprising a spectral filter configured to select a wavelength from the radiation source to enter the phased array, wherein the beam of radiation has the wavelength.

14. The system of claim 5, wherein the phase modulators are further configured to adjust the phases at a frequency of approximately 100 kHz or greater.

15. The system of claim 5, wherein the phase modulators are further configured to adjust the phases at a frequency of approximately 1 GHz or greater.

* * * * *